United States Patent
Elsherbini et al.

(10) Patent No.: US 12,315,794 B2
(45) Date of Patent: May 27, 2025

(54) SKIP LEVEL VIAS IN METALLIZATION LAYERS FOR INTEGRATED CIRCUIT DEVICES

(71) Applicant: Intel Corporation, Santa Clara, CA (US)

(72) Inventors: Adel Elsherbini, Tempe, AZ (US); Mauro Kobrinsky, Portland, OR (US); Shawna Liff, Scottsdale, AZ (US); Johanna Swan, Scottsdale, AZ (US); Gerald Pasdast, San Jose, CA (US); Sathya Narasimman Tiagaraj, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 18/088,476

(22) Filed: Dec. 23, 2022

(65) Prior Publication Data

US 2023/0130935 A1    Apr. 27, 2023

Related U.S. Application Data

(63) Continuation of application No. 16/727,747, filed on Dec. 26, 2019.

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76816* (2013.01); *H01L 21/76877* (2013.01); *H01L 23/5283* (2013.01); *H01L 23/5286* (2013.01)

(58) Field of Classification Search
None
See application file for complete search history.

(56) References Cited

U.S. PATENT DOCUMENTS

| 5,691,568 A | 11/1997 | Chou |
| 6,072,690 A | 6/2000 | Farooq |

(Continued)

FOREIGN PATENT DOCUMENTS

| JP | 05129518 | 5/1993 |
| JP | 2004-111748 | 4/2004 |

(Continued)

OTHER PUBLICATIONS

Office Action from Japanese Patent Application No. 2022-513630, mailed Mar. 19, 2024, 5 pgs.

(Continued)

*Primary Examiner* — Anthony Ho
(74) *Attorney, Agent, or Firm* — Schwabe, Williamson & Wyatt P.C.

(57) ABSTRACT

An integrated circuit device may be formed including an electronic substrate and a metallization structure on the electronic substrate, wherein the metallization structure includes a first level comprising a first dielectric material layer, a second level on the first level, wherein the second level comprises a second dielectric material layer, a third level on the second level, wherein the third level comprises a third dielectric material layer, at least one power/ground structure in the second level, and at least one skip level via extending at least partially through the first dielectric material layer of the first level, through the second dielectric layer of the second level, and at least partially through the third dielectric material layer of the third level, wherein the at least one skip level via comprises a continuous conductive material.

12 Claims, 11 Drawing Sheets

(56) References Cited

U.S. PATENT DOCUMENTS

| | | | |
|---|---|---|---|
| 6,518,670 | B1 | 2/2003 | Mandelman |
| 7,515,434 | B2 | 4/2009 | Wyrzykowska |
| 7,990,228 | B2 | 8/2011 | Uematsu |
| 8,153,906 | B2 | 4/2012 | Hsu |
| 9,601,472 | B2 | 3/2017 | Keser |
| 9,659,850 | B2 | 5/2017 | We |
| 9,911,651 | B1 | 3/2018 | Briggs |
| 10,607,938 | B1 | 3/2020 | Rubin |
| 2005/0041405 | A1 | 2/2005 | Kawagoe |
| 2006/0180905 | A1 | 8/2006 | Zeng |
| 2006/0226928 | A1 | 10/2006 | Henning |
| 2006/0289202 | A1 | 12/2006 | Takeuchi |
| 2007/0271783 | A1 | 11/2007 | Ikeda |
| 2008/0266031 | A1 | 10/2008 | Uematsu |
| 2011/0017503 | A1 | 1/2011 | Hardin |
| 2012/0007255 | A1 | 1/2012 | Shirota |
| 2017/0154844 | A1 | 6/2017 | Kim |
| 2018/0033718 | A1 | 2/2018 | Kaltalioglu |
| 2018/0166568 | A1 | 6/2018 | Samra et al. |

FOREIGN PATENT DOCUMENTS

| | | |
|---|---|---|
| JP | 2008258312 | 10/2008 |
| JP | 2015-167180 | 9/2015 |
| WO | WO 2019193896 | 10/2019 |

OTHER PUBLICATIONS

Office Action from U.S. Appl. No. 16/727,747, mailed Aug. 5, 2024, 22 pgs.
Office Action from Korean Patent Application No. 10-2022-7010781, mailed Sep. 28, 2024, 10 pgs.
Office Action from U.S. Appl. No. 16/727,747, mailed Oct. 12, 2023, 12 pgs.
Extended Search Report from European Patent Application No. 20908371.6, mailed Dec. 15, 2023, 7 pgs.
International Search Report and Written Opinion for PCT Application No. PCT/US2020/045719, mailed Nov. 19, 2020.
International Preliminary Report on Patentability for PCT Application No. PCT/US2020/045719, mailed Jun. 28, 2022, 8 pgs.
Office Action from Indian Patent Application No. 202247015601, mailed Feb. 21, 2023, 4 pgs.
Search Report from European Patent Application No. 22217053.2, mailed Apr. 21, 2023, 10 pgs.
Notice of Allowance from Japanese Patent Application No. 2022-513630, mailed Jul. 23, 2024, 1 pgs.

SKIP LEVEL VIAS IN METALLIZATION LAYERS FOR INTEGRATED CIRCUIT DEVICES

CROSS-REFERENCE TO RELATED APPLICATIONS

This application is a continuation of U.S. patent application Ser. No. 16/727,747, filed on Dec. 26, 2019, the entire contents of which is hereby incorporated by reference herein.

TECHNICAL FIELD

Embodiments of the present description generally relate to the field of integrated circuit device fabrication, and, more specifically, to the fabrication of metallization structures within integrated circuit devices.

BACKGROUND

The integrated circuit industry is continually striving to produce ever faster, smaller, and thinner integrated circuit devices for use in various electronic products, including, but not limited to, computer servers and portable products, such as portable computers, electronic tablets, cellular phones, digital cameras, and the like.

As these goals are achieved, metallization structures for signal and power connection of the integrated circuit device are also becoming smaller, i.e. pitches become smaller. As will be understood to those skilled in the art, thick metallization structures enable uniform power distribution due to their low resistance, as well as, additional thermal spreading. However, the thickness of the metallization structure also limited their minimum feature size (i.e. critical dimension "CD"). Thus, if the pitches in the metallization structures become smaller in order to achieve industry goals, power delivery and thermal spreading performance worsens. Thus, there is an ongoing effort to develop metallization structures that reduce critical dimensions without reducing power delivery and thermal spreading performance.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
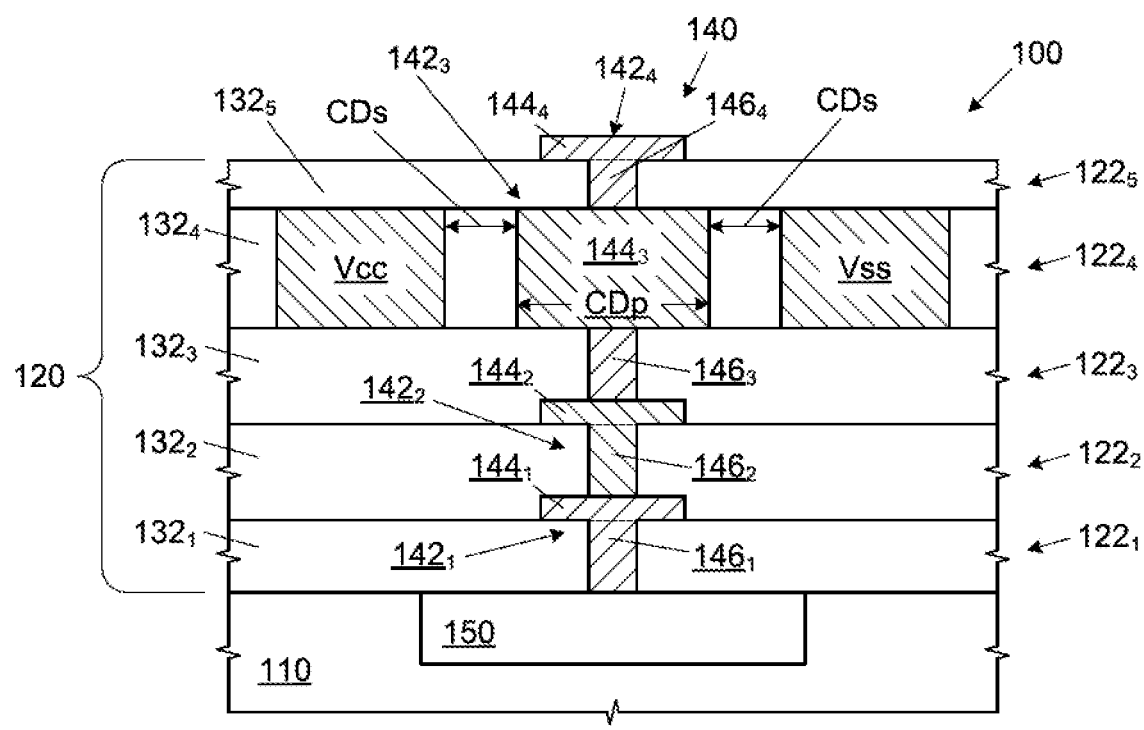
FIG. 1 is a side cross-sectional view of an integrated circuit device.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit device, comprising an electronic substrate; and a metallization structure on the electronic substrate, wherein the metallization structure includes a first level comprising a first dielectric material layer, a second level on the first level, wherein the second level comprises a second dielectric material layer, a third level on the second level, wherein the third level comprises a third dielectric material layer, at least one power/ground structure in the second level, and at least one skip level via extending at least partially through the first dielectric material layer of the first level, through the second dielectric layer of the second level, and at least partially through the third dielectric material layer of the third level, wherein the at least one skip level via comprises a continuous conductive material.

FIG. 1 illustrates an integrated circuit device 100, which includes an electronic substrate 110 having a metallization structure 120 formed thereon. At least one transistor 150 may be formed in or on the electronic substrate 110. The structure and circuitry of the at least one transistor 150 is well known in the art and is merely illustrated as a block (i.e. element 150) for purposes of clarity and conciseness. In one embodiment, the electronic substrate 110 may be a bulk substrate composed of a single crystal of a material which may include, but is not limited to, silicon, germanium, silicon-germanium or a III-V compound semiconductor material. In other embodiments, the electronic substrate 110 may comprise a silicon-on-insulator substrate (SOI), wherein an upper insulator layer composed of a material which may include, but is not limited to, silicon dioxide, silicon nitride or silicon oxy-nitride, disposed on the bulk substrate. Alternatively, the electronic substrate 110 may be formed directly from a bulk substrate and local oxidation is used to form electrically insulative portions in place of the above described upper insulator layer. The electronic substrate 110 may also be other types of substrates, such as germanium, gallium arsenide, indium antimonide, lead telluride, indium arsenide, indium phosphide, gallium arsenide, gallium antimonide, and the like, any of which may be combined with silicon. The integrated circuit device 100 may be any appropriate device, including, but not limited to, a microprocessor, a chipset, a graphics device, a wireless device, a memory device, an application specific integrated circuit device, a field-programmable gate array device, a chiplet, combinations thereof, stacks thereof, and the like. The electronic substrate 110 may also include through substrate vias (not shown) that may allow stacking the integrated circuit device 100 to other devices or electronic packages.

As will be understood to those skilled in the art, the metallization structure 120 may comprise a plurality of layers or levels, illustrated as levels $122_1$ through $122_5$. In an embodiment shown in FIG. 1, each of the levels (e.g. levels $122_1$-$122_5$) of the metallization structure 120 may comprise a dielectric material layer $132_1$-$132_5$, respectively, wherein at least a portion of a conductive route 140 is formed through at least one of the dielectric material layers $132_1$-$132_5$. In one embodiment as shown in FIG. 1, the at least one conductive route 140 may comprise a plurality of electrically coupled route segments (illustrated as elements $142_1$, $142_2$, $142_3$, and $142_4$). Each of the route segments $142_1$, $142_2$, $142_3$, and $142_4$ may comprise a conductive pad or trace $144_1$, $144_2$, $144_3$, and $144_4$ formed in or on at least one of the dielectric material layer $132_1$-$132_5$ with at least one conductive via $146_1$, $146_2$, $146_3$, and $146_4$ extending from its respective conductive trace $144_1$, $144_2$, $144_3$, and $144_4$ through at least one of the dielectric material layers $132_1$-$132_5$. In other embodiments, the electrical routes may be formed through capacitive coupling between two co-planar or stacked pads, such as the cases of capacitively coupled interconnects.

The dielectric material layers $132_1$-$132_5$ may comprise one or more dielectric material layers, which may be composed of an appropriate dielectric material, including, but not limited to, silicon oxide, silicon nitride, carbon doped dielectrics, fluorine doped dielectrics, porous dielectrics, organic polymeric dielectrics, and the like.

The at least one conductive trace $144_1$-$144_4$ and the at least one conductive via $146_1$-$146_4$ may be made of any appropriate conductive material, including but not limited to, metals, such as copper, silver, nickel, gold, and aluminum, alloys thereof, and the like. It is understood that if the conductive material is susceptible to migration, barrier layers (not shown) may be used. The conductive vias $146_1$-$146_4$ can be formed by any appropriate process known in the art, including, but not limited to, single or dual damascene process, lithographically defined vias, zero-misalignment vias, self-aligned vias, or the like. In one embodiment, the conductive route 140 may be a signal or I/O (Input/Output) route, which is electrically connected to the transistor 150 and possibly other devices, such as electrostatic protection circuits, voltage clamping circuits, passive devices, such as inductors, capacitors, resistors, or the like. This is merely shown as the conductive route 140 abutting the transistor 150, as the interconnection of the conductive route 140 and the transistor 150 involves processes and structures that are well known in the art and, for the purposes of clarity and conciseness, will not be illustrated or discussed herein.

As shown in FIG. 1, at least one of the levels, e.g. level $122_4$, may have at least one power/ground structure, illustrated as a power structure Vcc and a ground structure Vss for the operation of the at least one transistor 150. As with the conductive route 140, the interconnection of the power structure Vcc and the ground structure Vss with the transistor 150 involves processes and structures that are well known in the art and, for the purposes of clarity and conciseness, will not be illustrated or discussed herein. In one embodiment, the level $122_4$ containing the power structure Vcc and the ground structure Vss may be thicker than other levels, e.g. levels $122_1$-$122_3$ and $122_5$ of the metallization structure 120. The power structure Vcc and the ground structure Vss may be made of any appropriate conductive material, including but not limited to, metals, such as copper, silver, nickel, gold, and aluminum, alloys thereof, and the like.

The process of forming the metallization structure 120 requires the formation of conductive pad or trace $144_3$ for the conductive route 140 in the level $122_4$ containing the power structure Vcc and the ground structure Vss, which takes up space in level $122_4$. Thus, due to aspect ratio limitations resulting in large critical dimensions within level $122_4$, the power structure Vcc and the ground structure Vss need to be made smaller to support the pad or trace size CDp of the conductive pad or trace $144_3$ and spacing CDs therebetween. As will be understood to those skilled in the art, when the size of each of the power structure Vcc and the ground structure Vss, is reduced, the voltage drop at the same load current (or IR drop) may be greater, the current carrying capability of each may be reduced, and the thermal spreading performance may worsen.

Figure 2:
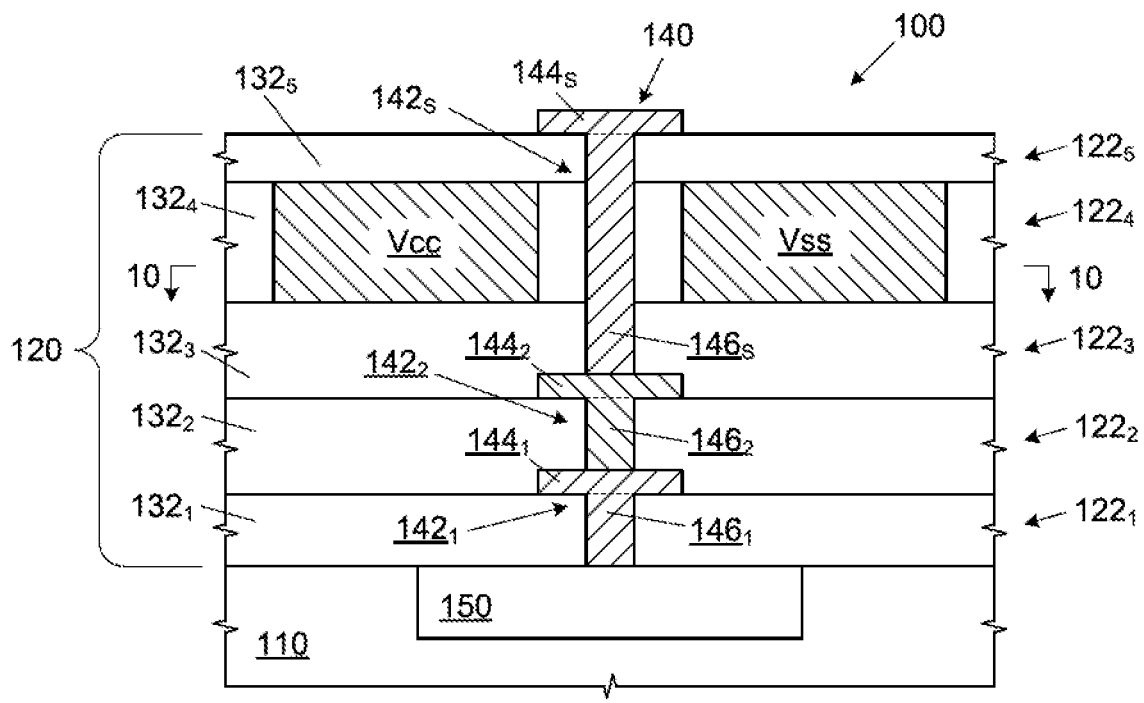
FIG. 2 is a side cross-sectional view of an integrated circuit device having a skip level via in a metallization structure thereof, according to one embodiment of the present description.

In one embodiment of the present description, the conductive pad or trace $144_3$ for the conductive route 140 in the level $122_4$ containing the power structure Vcc and the ground structure Vss, as shown in FIG. 1, may be replaced with a conductive via 146s (referred to a "skip level via" 146s), as shown in FIG. 2, that passes through or "skips" the "level" or level $122_4$. As shown in FIG. 2, the conductive via or "skip level" via 146s may extend through at least a portion of the dielectric material layer $132_3$ of level $122_3$, through the dielectric material layer $132_4$ of level $122_4$, and through at least a portion of the dielectric material layer $132_5$ of level $122_5$. The skip level via 146s is a continuous structure. For the purpose of the present description, the term "continuous" is defined to mean that there are no layers or breaks in continuity of the conductive material used to form the skip level via 146s, such as would result from a single deposition of the conductive material. Depending on the device design and power, more than one thick layer similar to $122_4$ may exist, and in this case the via may go through all of the thick layer in order to avoid impacting the performance of the power structures or planes.

Figure 3:
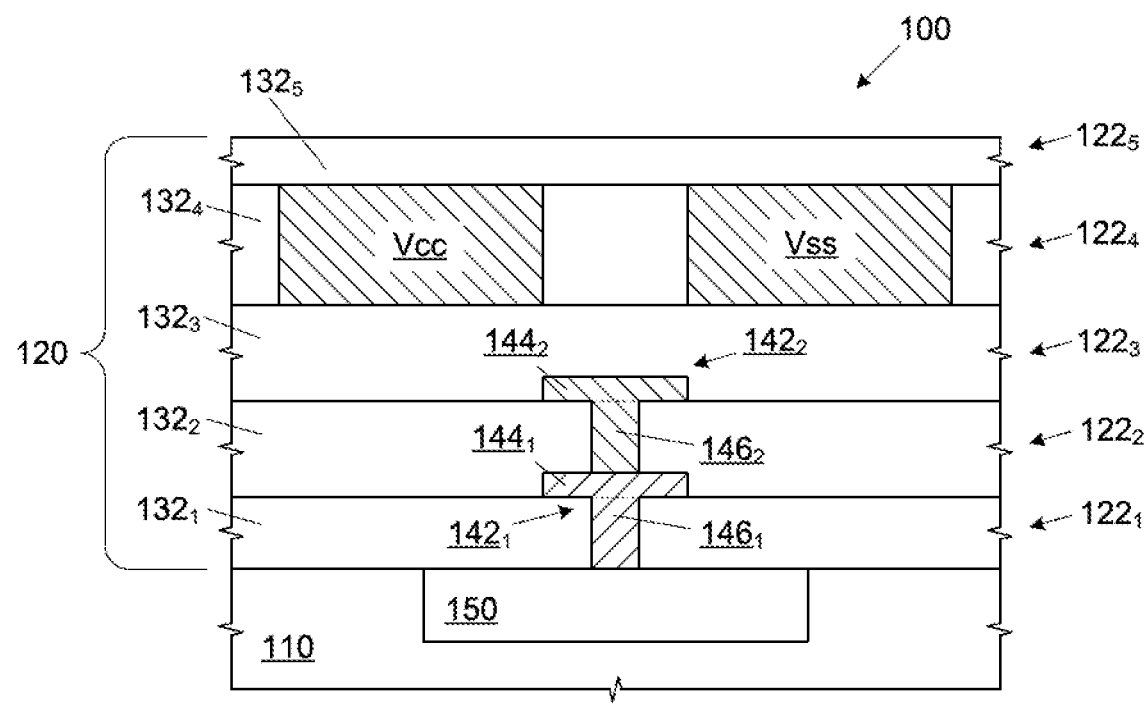
FIGS. 3-9 are side cross-sectional views of process of forming skip level vias in the metallization structure of an integrated circuit device, according to one embodiment of the present description.
Figure 4:
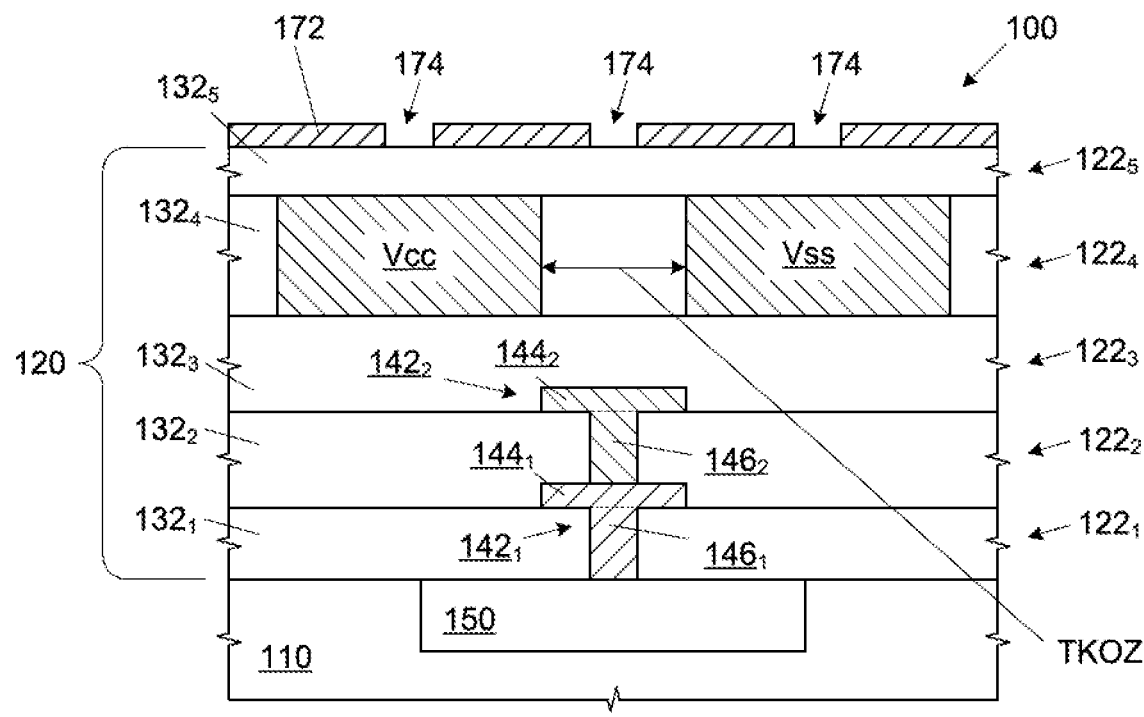

The formation of the skip level via 146s requires a unique formation process, as illustrated in FIG. 3-9. As shown in FIG. 3, the levels $122_1$-$122_5$ may be formed on the electronic substrate 110 in the manner previously discussed without the formation of the conductive trace $144_3$ (see FIG. 1) within level $122_4$ and without the associated conductive vias $146_3$ and $146_4$ (see FIG. 1). As shown in FIG. 4, a photoresist material 172 may be deposited on level $122_5$ and patterned by light exposure, as well known in the art, to form at least one opening 174 therein. As will be understood to those skilled in the art, the exposure of the photoresist material 172 for the opening 174 for the skip level via 146$s$ (see FIG. 2) may be aligned relative to the power structure Vcc and the ground structure Vss, which may help reduce a through keep-out zone TKOZ, as will be discussed, or may be aligned relative to the trace $144_2$, which may help reduce it size and allow more area for routing. The choice will depend on the specific process, alignment capabilities, and design requirements.

Figure 5:
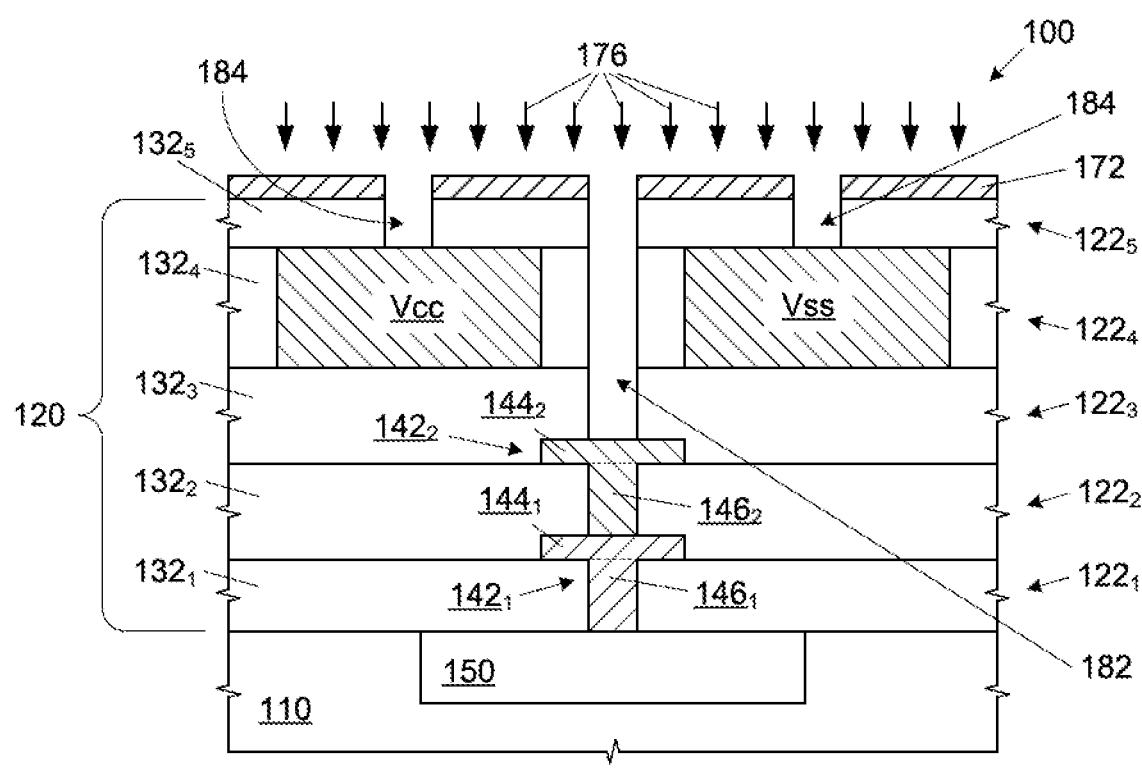

As shown in FIG. 5, an etchant (shown as arrows 176) may be introduced to form a skip level via opening 182 through at least a portion of the dielectric material layer $132_5$, through the dielectric material layer $132_4$, and through at least a portion of the dielectric material layer $132_3$ to expose at least a portion of conductive trace $144_2$. The photoresist material 172 may have openings 174 that also form via openings 184 in the dielectric material layer $132_5$ to expose at least a portion of the power structure Vcc and the ground structure Vss. The etching process may use multiple etchants and/or multiple steps (e.g. to remove different types of dielectrics that may be used in the different layers).

Figure 6:
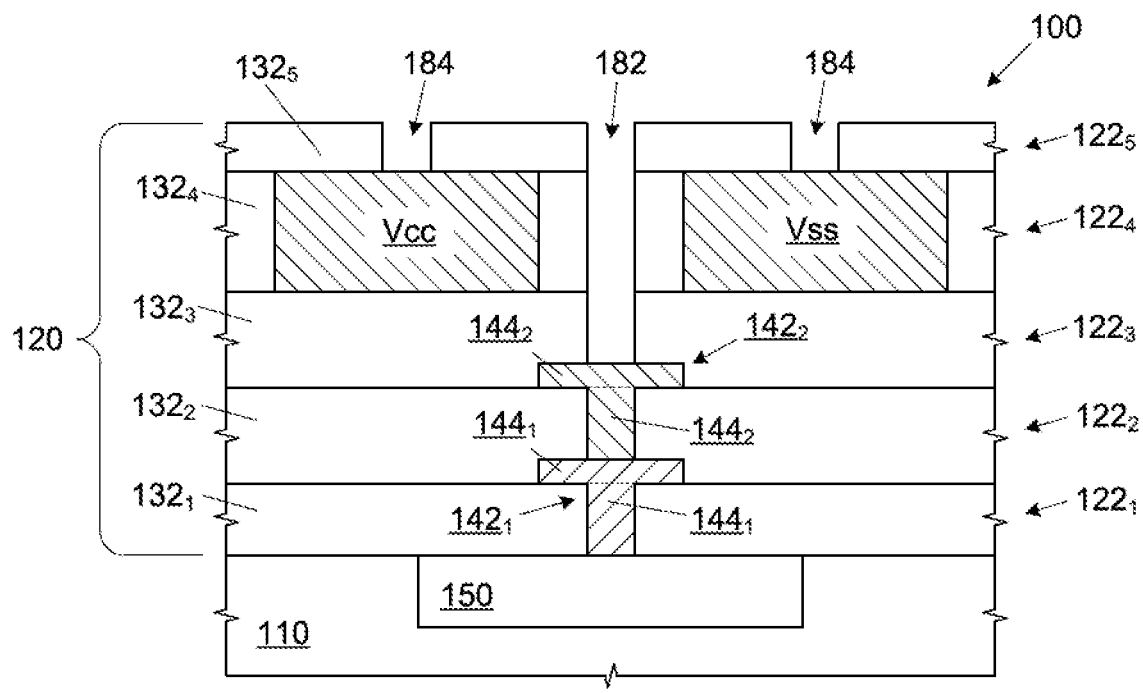
Figure 7:
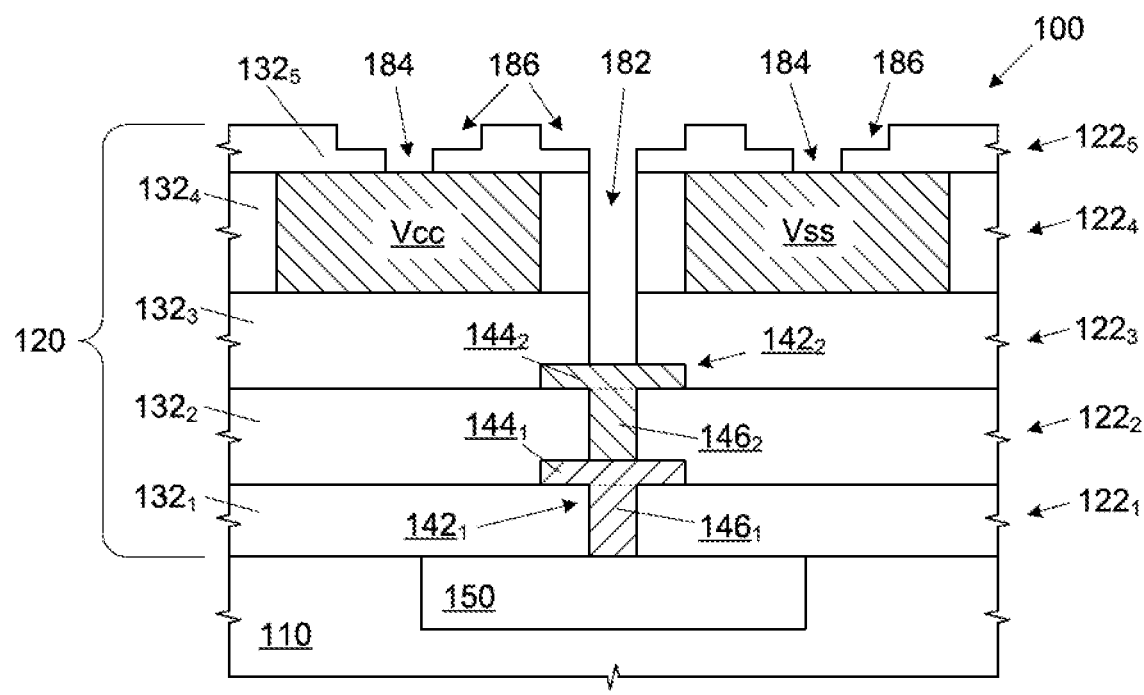
Figure 8:
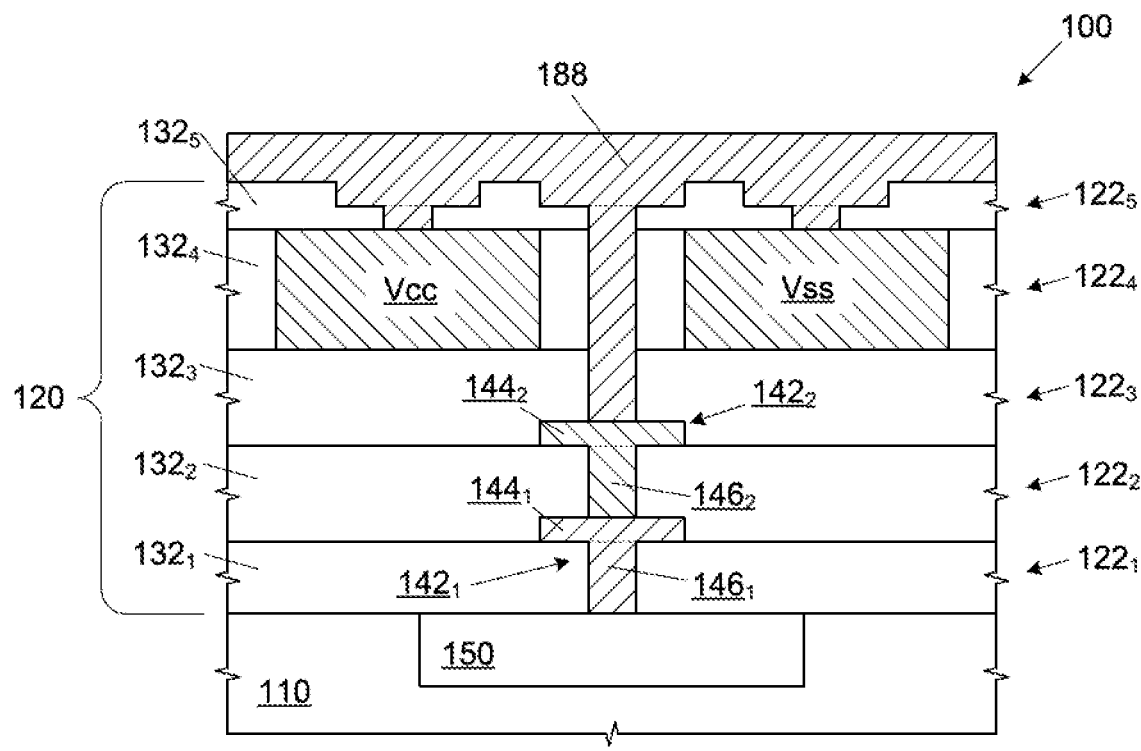
Figure 9:
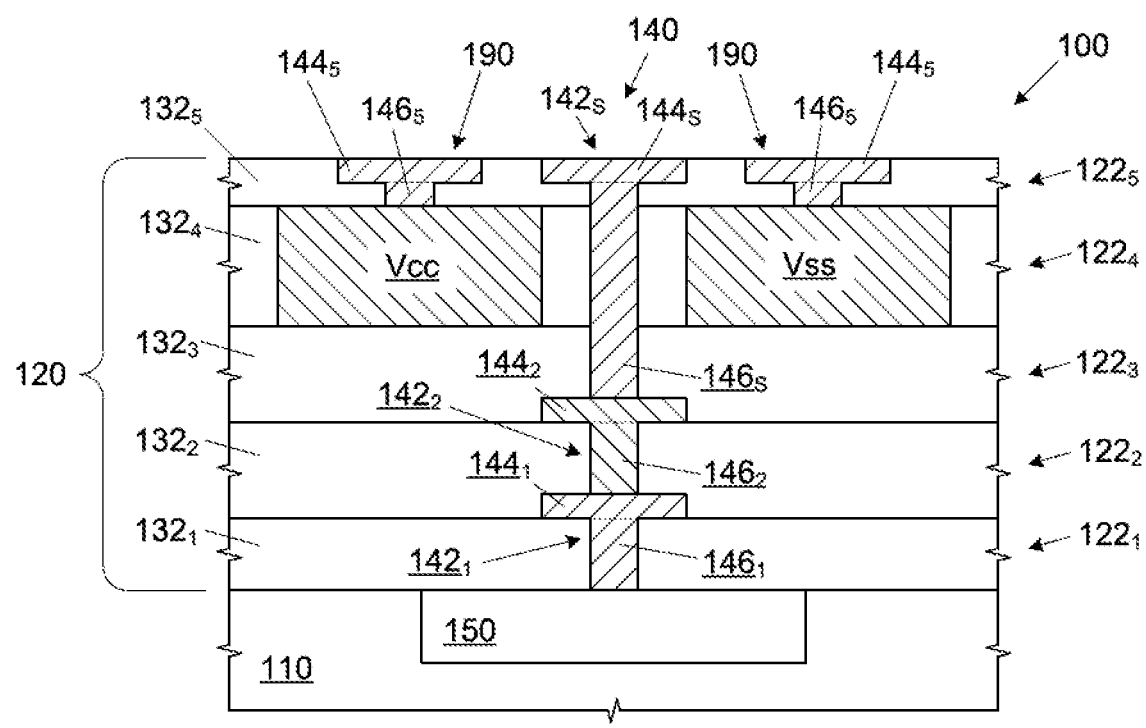

As shown in FIG. 6, the lithographic mask 172 (see FIG. 5) may be removed and pad/trace recesses 186 formed in dielectric material layer $132_5$ at each of the via openings 182 and 184, as shown in FIG. 7 (e.g. through another lithography and etch step). As shown in FIG. 8, a conductive material 188 may be formed over dielectric material layer $132_5$ and substantially filling the openings 182, 184, and recesses 186 (shown in FIG. 7), such as by seed deposition and electroplating, as known in the art. As shown in FIG. 9, any overburden of the conductive material 188 may be removed, such as by polishing, to form a route segment 142$s$ including the skip level via 146$s$ and a conductive trace 144$s$, as well as, contact structures 190 comprising at least one conductive trace $144_5$ and at least one conductive via $146_5$ for each of the power structure Vcc and the ground structure Vss. The conductive traces $144_5$ and 144$s$ may be of any suitable shape, such as circular, rectangular, square, hexagonal, and the like.

The method shown and described with regard to FIG. 3-9 uses a single mask process for creating the opening 182 for the skip level via 146$s$ and the openings 184 for the power structure Vcc and the ground structure Vss. Such a process may be preferred since it results in substantially no misalignment. However, if small misalignment is tolerable, such as for mixed critical dimensions where the power structure Vcc and the ground structure Vss power are larger than the pad or trace $144_2$ for the skip level via 146$s$, a multiple process steps and masks may be used. Alternatively, as will be understood those skilled in the art, multi-color lithography techniques may be used.

As will be understood to those skilled in the art, the embodiments of the present description may enable a higher density of conductive routes 140 (see FIG. 9) with an IR drop that is comparable to known configurations or a substantially lower IR drop with substantially the same density of conductive routes 140 (see FIG. 9) to known configurations. The embodiments of the present description may be achieved with minimal additional processing steps. Furthermore, removing the conductive trace $144_3$ (see FIG. 1) in the level $122_4$ with the power structure Vcc and the ground structure Vss may reduce parasitic capacitance thereto and to capacitors (not shown) that may be formed within the metallization structure 120. This may allow for the use of smaller drivers with lower power and may allow for operation at higher data rates, as will be understood to those skilled in the art. Moreover, as larger power structure Vcc and the ground structure Vss may be fabricated (as previously discussed) inductive/resistive noise coupling may be reduced, which, in turn, may improve data rates and/or signaling power.

Although the embodiments of the present description, as shown in FIGS. 2-9, only illustrate the skip level via extending entirely through one dielectric material layer, i.e. dielectric material layer $132_4$, and at least partially through a dielectric material layer above, i.e. dielectric material layer $132_5$, and a dielectric layer below, i.e. dielectric material layer $132_3$, the embodiments of the present description are not so limited, as the skip level via may extend partially and/or entirely through any number of levels, e.g. $122_1$-$122_5$, which may reduce resistance, particularly when barrier layers (not shown), as previously discussed, need to be utilized, since fewer will be in the current path, as will be understood to those skilled in the art. It is understood that the number of dielectric layers that are possible to extend through will depend on the process limitations and thermomechanical considerations of the integrated circuit device 100, as well as the maximum current carrying capacity thereof.

Figure 10:
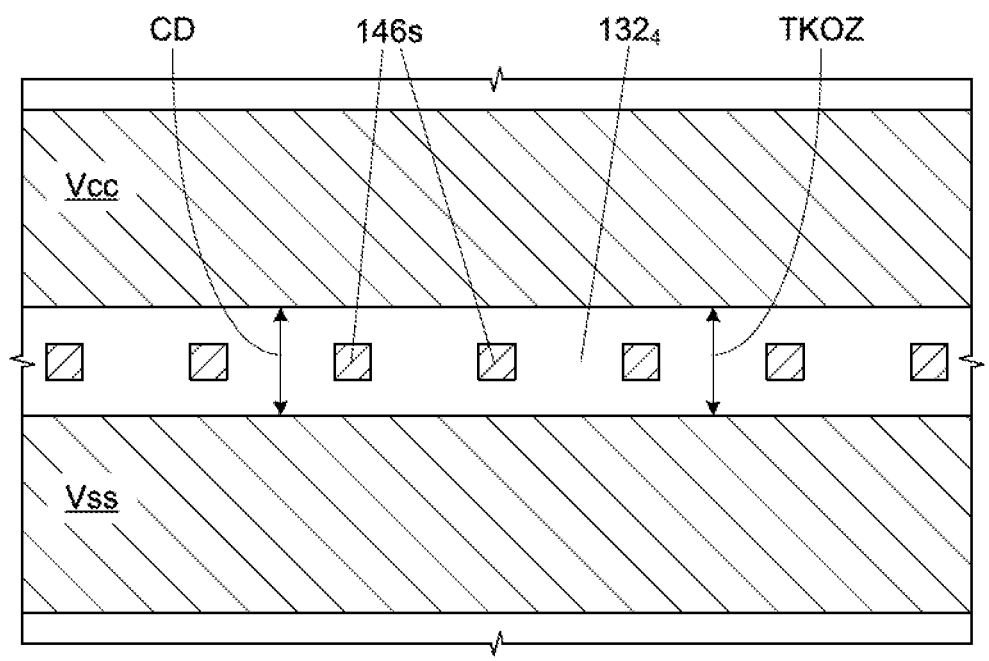
FIGS. 10-12 are top plan views of configurations for skip level vias in the metallization structure of an integrated circuit device, according to an embodiment of the present description.
Figure 11:
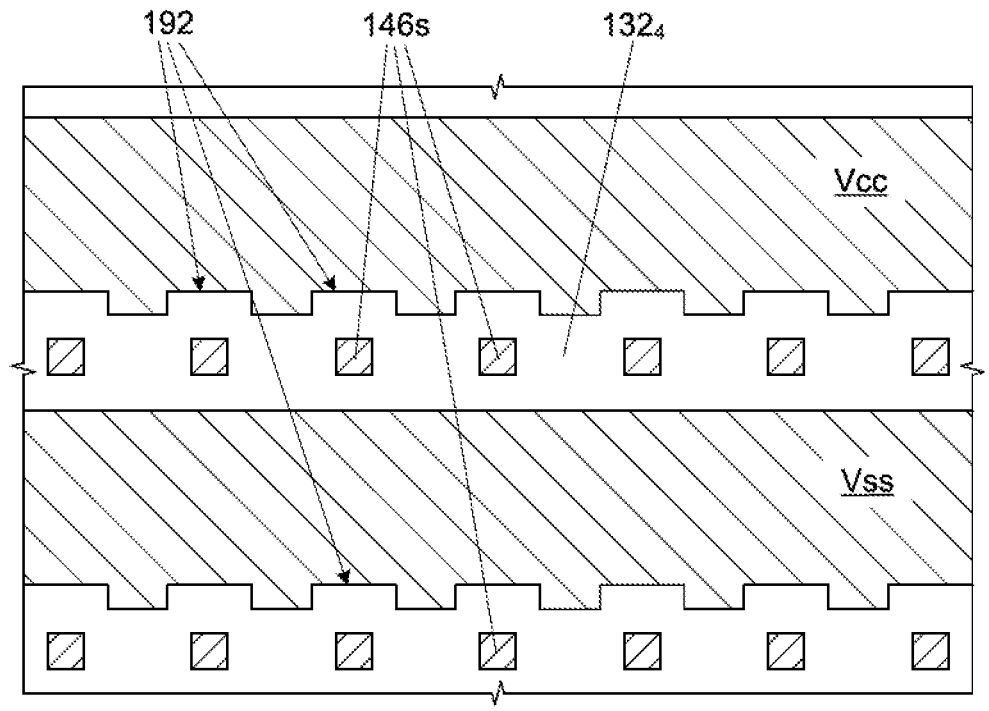
Figure 12:
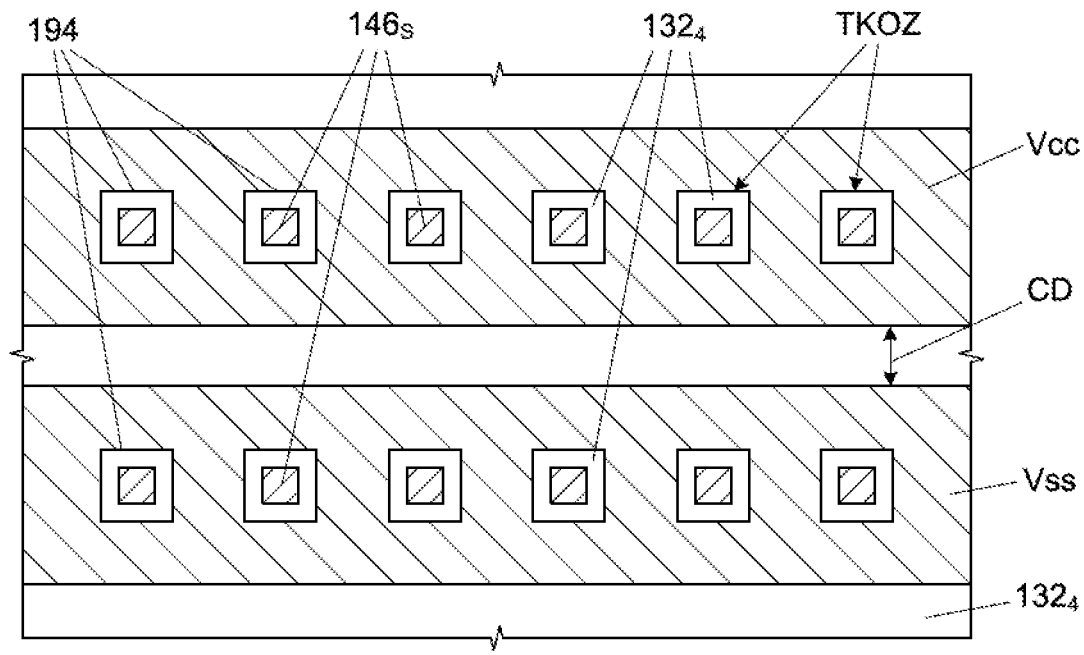

The skip level vias 146$s$ may be in any appropriate position and configuration. However, the basic structure of the embodiments of the present description may use a "keep-out zone" through the dielectric material layer $132_4$ (referred to as a "Through Keep-Out Zone" or "TKOZ") that is as close to critical dimensions CD as possible to minimize the resistance of the power delivery network (not shown) of which the power structure Vcc and the ground structure Vss are a part. However, it is understood that since the skip level vias 146$s$ are created at a different step and level than the metallization, it is not limited by the standard lithographic critical dimension to which it is related (e.g. the minimum allowed photoresist width). In one embodiment, as shown in FIG. 10 (view along line 10-10 of FIG. 2), the skip level vias 146$s$ may be positioned in the space (i.e. the critical dimension CD) between the power structure Vcc and the ground structure Vss, such that the through keep-out zone TKOZ would be substantially equal to the critical dimension CD. In another embodiment, as shown in FIG. 11, if there is a potential for excessive misalignment of the skip level via 146$s$ or if there are concerns with diffusion or drift of the conductive material used to form the skip level via 146$s$, the through keep-out zone TKOZ (see FIG. 10) may be expanded by forming notches 192 in the power structure Vcc and/or the ground structure Vss. In still another embodiment, as shown in FIG. 12, the power structure Vcc and/or the ground structure Vss may have at least one opening 194 formed therethrough with a portion of the dielectric material layer $132_4$ within the at least one opening 194. The skip level via 146$s$ may extend through the at least one opening 194 and separated from the power structure Vcc and the ground structure Vss by a portion of the dielectric material layer $132_4$ therein. The periphery (not specifically labeled) of the at least one opening 194 may define the through keep-out zone TKOZ.

Figure 13:
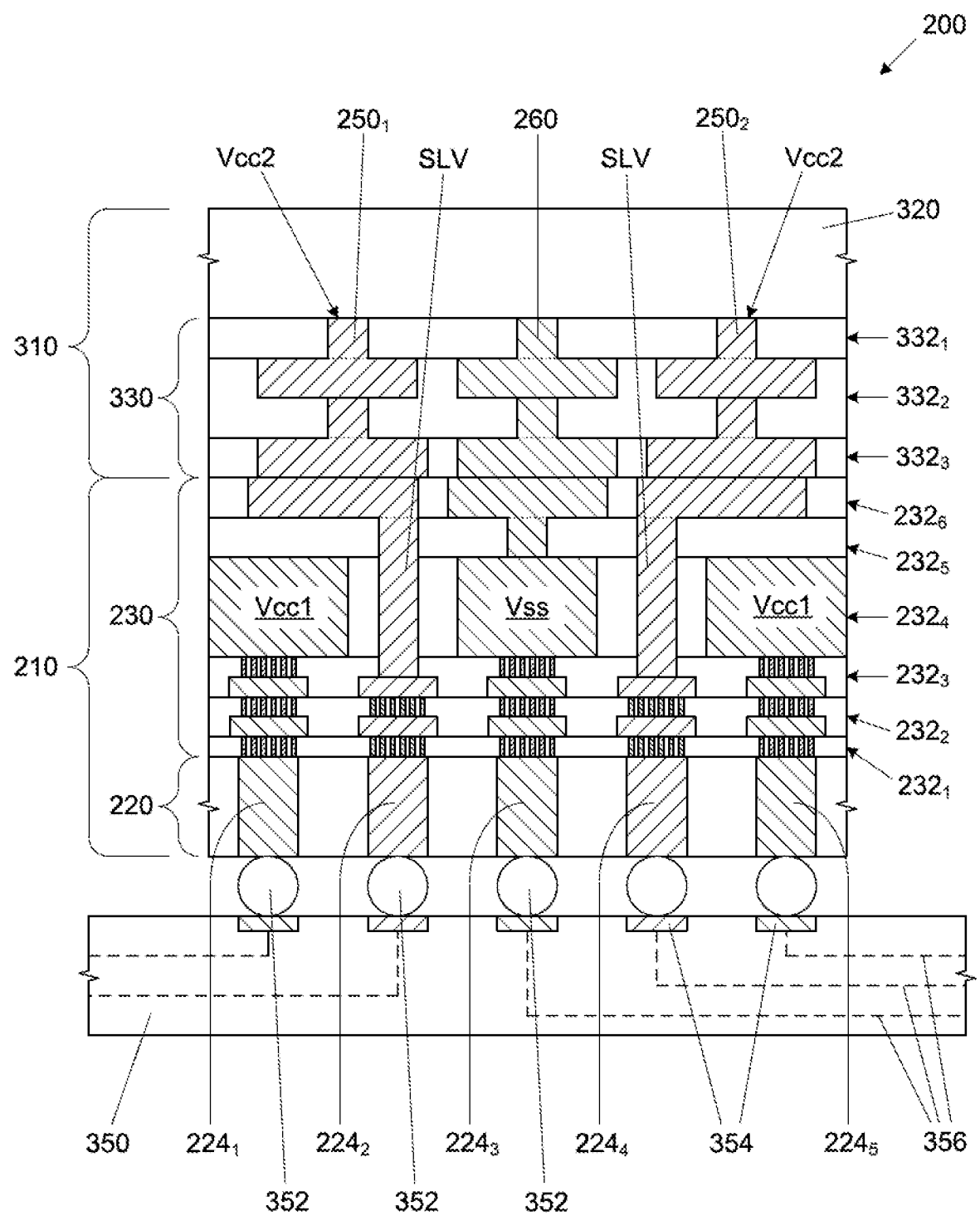
FIG. 13 is a side cross-sectional view of a stacked device package, according to one embodiment of the present description.

Although the embodiments of FIGS. 2-12 contemplate the skip level via 146$s$ being utilized for signal or I/O (Input/Output) routing purposes, the subject matter of the present description is not so limited. In a further embodiment of the present description, in a stacked device package 200, the skip level via may be used to deliver power through a first integrated circuit device 210 to a second integrated circuit device 310. As shown in FIG. 13, the first integrated circuit device 210 may comprise a first electronic substrate 220 having a first metallization structure 230 formed thereon, wherein the first metallization structure 230 may comprise a plurality of levels, illustrated as levels $232_1$ through $232_6$. As further shown in FIG. 13, the second integrated circuit device 310 may comprise a second electronic substrate 320 having a second metallization structure 330 formed thereon, wherein the second metallization structure 330 may comprise a plurality of levels, illustrated as levels $332_1$ through $332_3$.

In one embodiment, the first integrated circuit device 210 may be electrically attached to the second integrated circuit device 310 by a hybrid bonding technique to form the electrical connection therebetween. With the hybrid bonding technique, the dielectric material layer (not labeled) of level $232_6$ of the first metallization layer 230 of the first integrated circuit device 210 forms a chemical bond (such as a covalent bond) with a dielectric material layer (not labeled) of level $332_3$ of the second metallization layer 330 of the second integrated circuit device 310 at room temperature (e.g. about 25 degrees Celsius). At least one conductive trace or pad (not labeled) in level $232_6$ of the first metallization layer 230 of the first integrated circuit device 210 may be aligned with at least one conductive trace or pad (not labeled) of level $332_3$ of the metallization layer 330 of the second integrated circuit device 310. Heat is then applied which forms a stronger bond between the dielectric material layer (not labeled) of level $232_6$ of the first metallization layer 230 of the first integrated circuit device 210 and the dielectric material layer (not labeled) of level $332_3$ of the second metallization layer 330 of the second integrated circuit device 310. The heat also simultaneously results in the at least one conductive trace or pad (not labeled) in level $232_6$ of the first metallization layer 230 of the first integrated circuit device 210 and the at least one conductive trace or pad (not labeled) of level $332_3$ of the second metallization layer 330 of the second integrated circuit device 310 expanding and fusing to form a permanent bond.

As shown in FIG. 13, the first through-silicon via $224_1$ and the fifth through-silicon via $224_5$ may route a first power voltage Vcc1 to the first metallization layer 230 to be utilized in the first integrated circuit device 210. The third through-silicon via $224_3$ may be a part of a conductive route 260 to provide a ground route Vss within the first metallization layer 230 for the first integrated circuit device 210, wherein the conductive route 260 also runs within metallization layer 330 to provide the ground route for the second integrated circuit device 310. The second through-silicon via $224_2$ may be part of a conductive route $250_1$ and the fourth through-silicon via $224_4$ may be part of a conductive route $250_2$, both of which route a second power voltage Vcc2 to the metallization layer 330 to be utilized in the second integrated circuit device 310. As shown in FIG. 13, the conductive route $250_1$ and the conductive route $250_2$ each include a skip level via SLV for passing though level $232_4$ within the first metallization layer 230, which contains the power structures and ground structures for the first integrated circuit device 210 in the manner discussed in FIGS. 2-12. The embodiment shown in FIG. 13 may mitigate two challenge with regard to device stacking, which are metal layer pad/trace consumption of the top device, i.e. integrated circuit device 310, and resistance through the first metallization structures 230 and the second metallization structure 330 to reach the through-silicon vias $224_1$-$224_5$. As will be understood to those skilled in the art, when the first integrated circuit device 210 and the second integrated circuit device 310 operate at the same voltage, due to noise levels and IR drop, the voltages at the transmitter and receiver circuits (not shown) of the first integrated circuit device 210 and the second integrated circuit device 310 may be different, which requires adding large guard bands in the design. With the embodiments of the present description, inductive and resistive voltage drop is significantly reduced, which may result in reduced guard bands and improved performance.

As further shown in FIG. 13, the stacked device package 200 may be attached to an electronic interposer, organic package, or board 350 through a plurality of package-to-board interconnects 352, such as reflowable solder bumps or balls, in a configuration generally known as a flip-chip or controlled collapse chip connection ("C4") configuration. The package-to-board interconnects 352 may extend between the through-silicon vias $224_1$-$224_5$ of the stacked device package 200 and corresponding bond pads 354 on or in the electronic board 350 to form electrical connections therebetween. The electronic board 350 may provide electrically conductive routes 356 between the stacked device package 200 and external components (not shown).

The package-to-board interconnects 352 may be any appropriate electrically conductive material or structure, including but not limited to, solder balls, metal bumps or pillars, metal filled epoxies, or a combination thereof. In one embodiment, the package-to-board interconnects 352 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the package-to-board interconnects 352 may be copper bumps or pillars. In a further embodiment, the package-to-board interconnects 352 may be metal bumps or pillars coated with a solder material.

The embodiment shown in FIG. 13 illustrates an integrated circuit package 200 wherein the through-silicon vias $224_1$-$224_5$ are formed through the first electronic substrate 220 prior to the formation of the first metallization structure 230 of the first integrated circuit device 210. However, the embodiments of present description are not so limited. In a further embodiment shown in FIG. 14, the through-silicon vias $224_1$-$224_5$ may be formed through the first electronic substrate 220 after the formation of the first metallization structure 230 of the first integrated circuit device 210. This will allow for the through substrate vias $224_1$-$224_5$ to extend into the first metallization layer 230 and reduce the number of traces/pads and vias that need to be formed therein.

Figure 14:
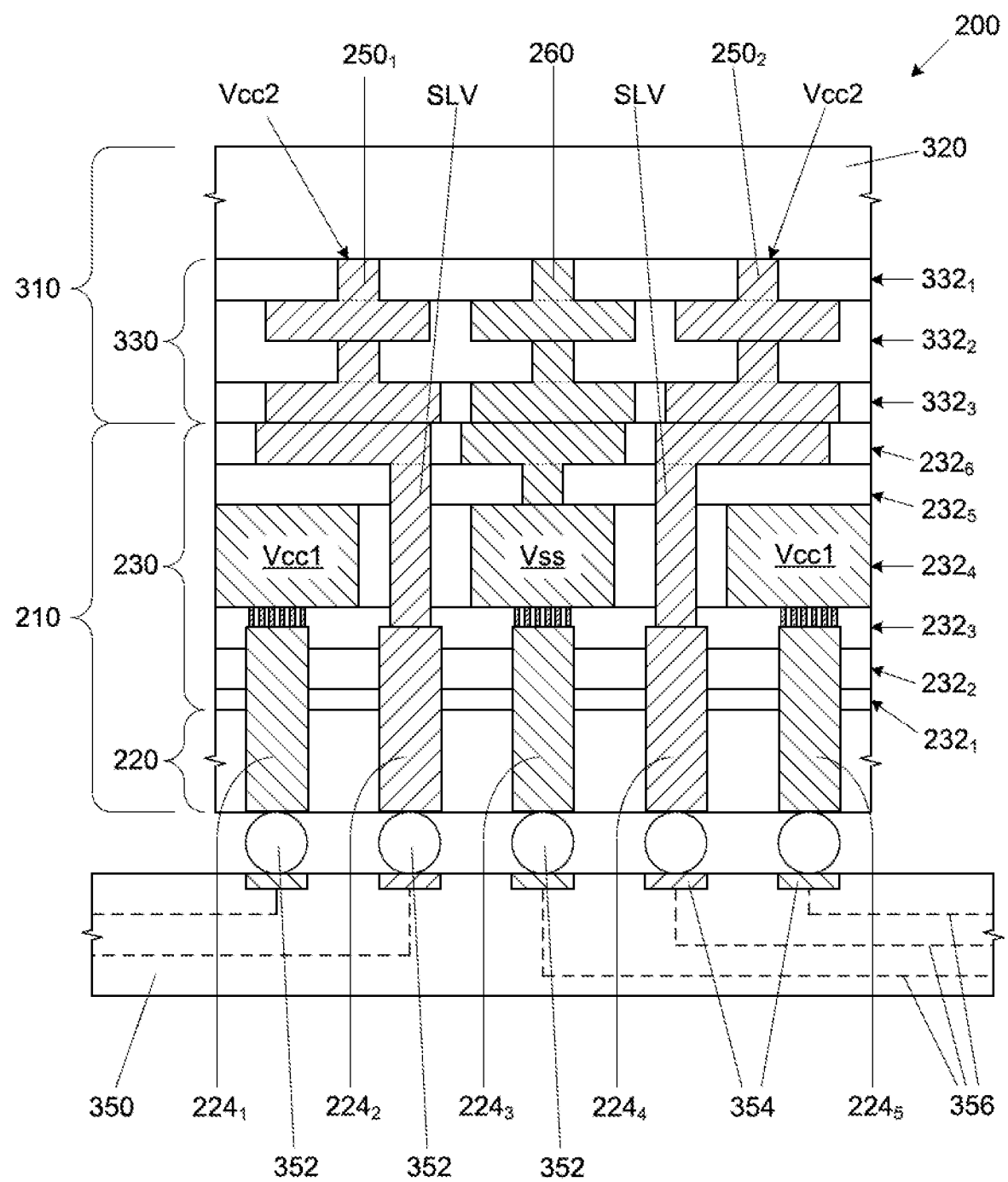
FIG. 14 is a side cross-sectional view of a stacked device package, according to another embodiment of the present description.
Figure 15:
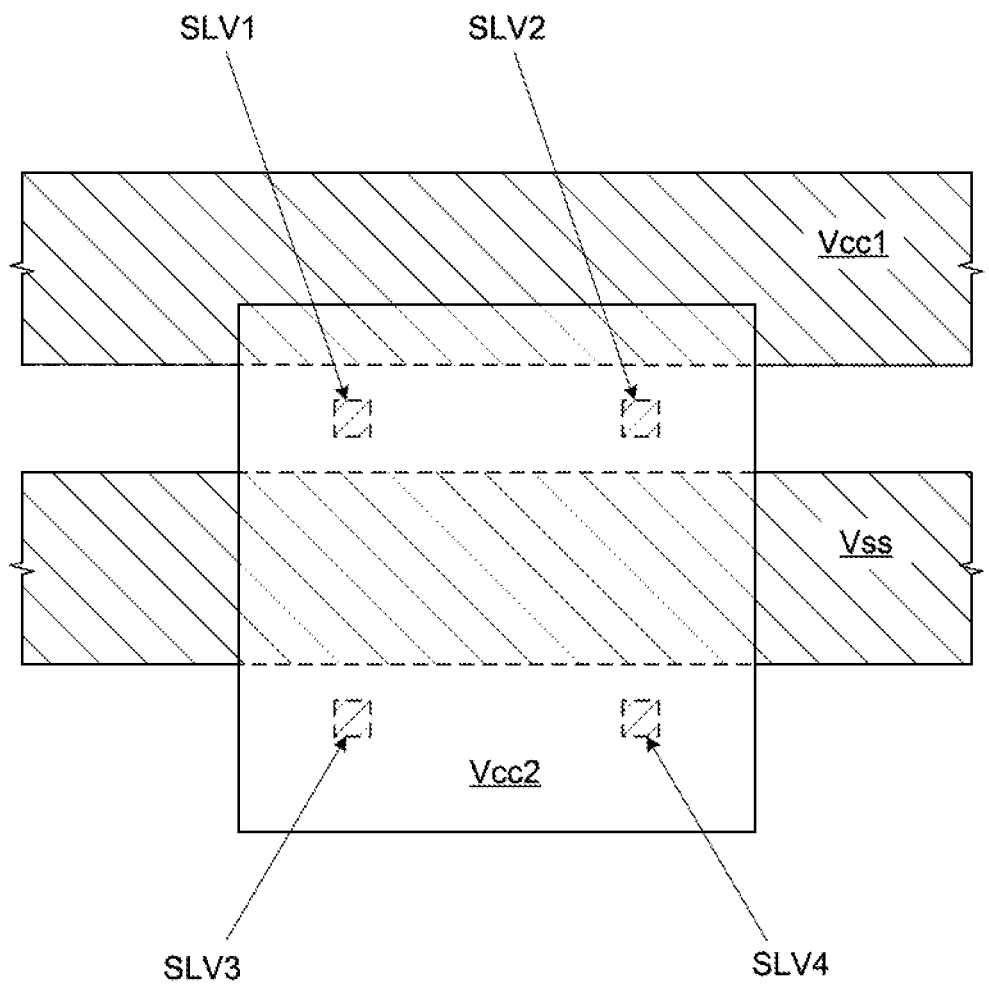
FIG. 15 is a top plan view of a configuration of multiple skip level vias per pad or trace, according to an embodiment of the present description.

For power delivery embodiments, such as shown in FIGS. 13 and 14, it may be advantageous to have more than one skip level via electrically connected to a single trace or pad, rather than a single, relatively thick skip level via. As shown in FIG. 15, a plurality of skip level vias (labelled as SLV1-SLV4) may extend between or beside the ground structure Vss and first power structure Vcc1 to contact a second power structure Vcc2. The associated dielectric material layers are not illustrated for clarity and conciseness. Such a configuration may help reduce resistance and may help reduce thermomechanical stress near the skip level vias SLV1-SLV4 compared to a single thick skip level via, such as skip level via 142s of FIG. 2.

Figure 16:
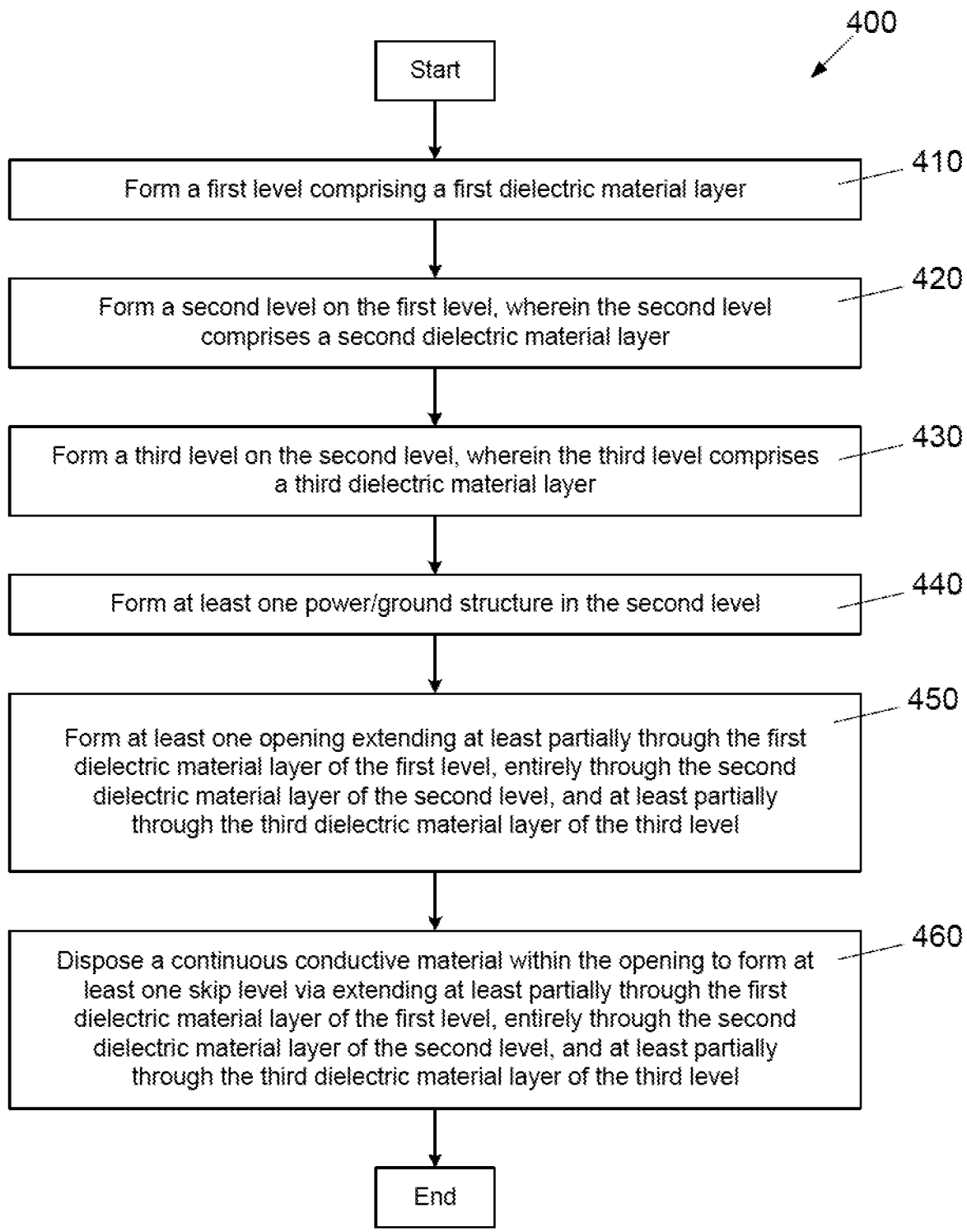
FIG. 16 is a flow diagram of a process of fabricating an integrated circuit device, according to an embodiment of the present description.

FIG. 16 is a flow chart of a process 400 of fabricating an integrated circuit package according to an embodiment of the present description. As set forth in block 410, a first level comprising a first dielectric material layer may be formed. A second level may be formed on the first level, wherein the second level comprises a second dielectric material layer, as set forth in block 420. As set forth in block 430, a third level may be formed on the second level, wherein the third level comprises a third dielectric material layer. At least one power/ground structure may be formed in the second level, as set forth in block 440. As set forth in block 450, at least one opening may be formed to extend at least partially through the first dielectric material layer of the first layer, through the second dielectric material layer of the second layer, and at least partially through the third dielectric material layer of the third level. A continuous conductive material may be disposed within the opening to form a skip level via extending at least partially through the first dielectric material layer of the first layer, through the second dielectric material layer of the second layer, and at least partially through the third dielectric material layer of the third level, as set forth in block 460.

Figure 17:
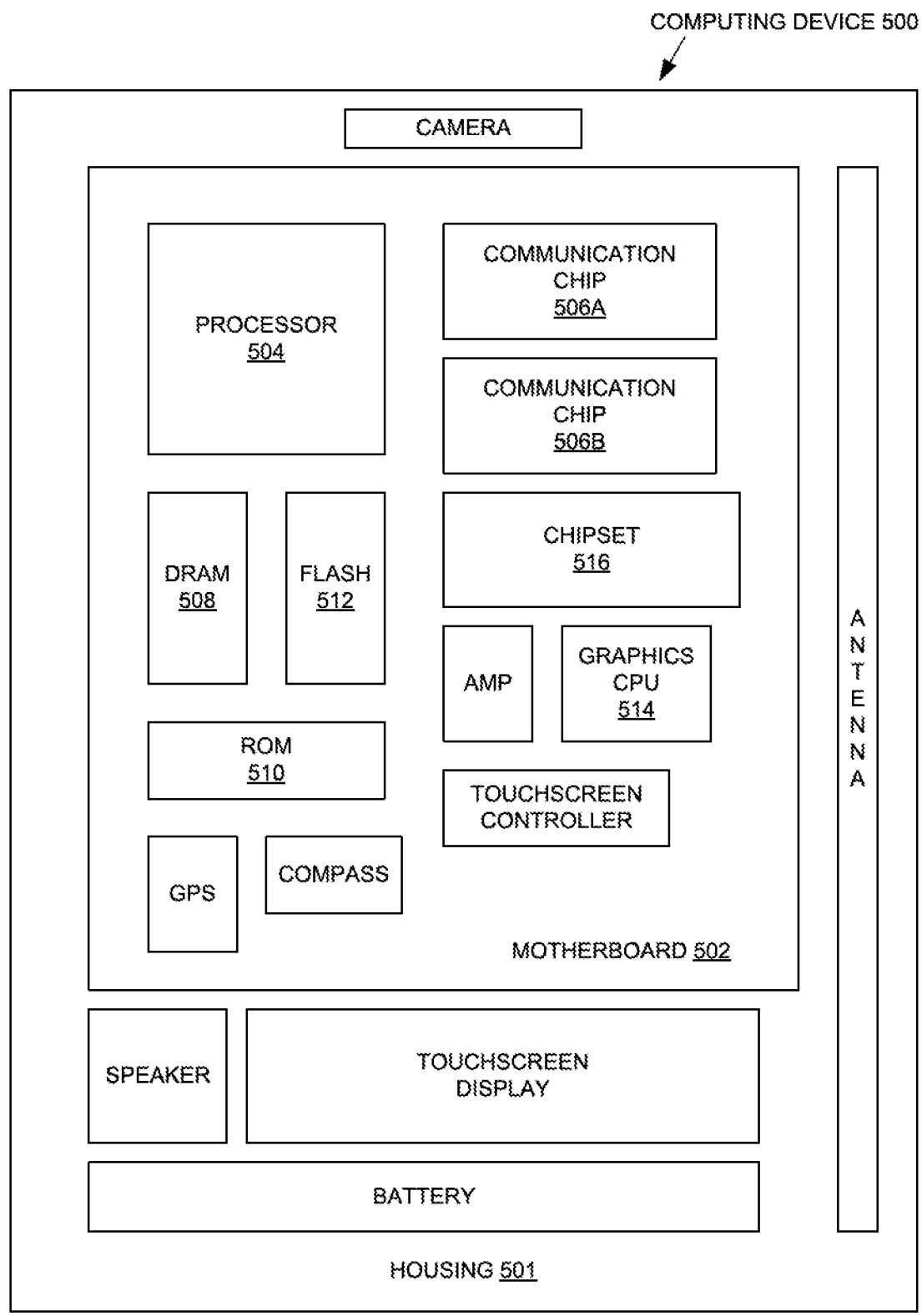
FIG. 17 is an electronic system, according to one embodiment of the present description.

FIG. 17 illustrates an electronic system or computing device 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip or device may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit device including an electronic substrate and a metallization structure on the electronic substrate, wherein the metallization structure includes a first level comprising a first dielectric material layer, a second level on the first level, wherein the second level comprises a second dielectric material layer, a third level on the second level, wherein the third level comprises a third dielectric material layer, at least one power/ground structure in the second level, and at least one skip level via extending at least partially through the first dielectric material layer of the first level, through the second dielectric layer of the second level, and at least partially through the third dielectric material layer of the third level, wherein the at least one skip level via comprises a continuous conductive material.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-17. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit structure, comprising a first level comprising a first dielectric material layer; a second level on the first level, wherein the second level comprises a second dielectric material layer; a third level on the second level, wherein the third level comprises a third dielectric material layer; at least one power/ground structure in the second level; and at least one skip level via extending at least partially through the first dielectric material layer of the first level, through the second dielectric material layer of the second level, and at least partially through the third dielectric material layer of the third level, wherein the at least one skip level via comprises a continuous conductive material.

In Example 2, the subject matter of Example 1 can optionally include the at least one power/ground structure comprising a power structure and a ground structure, and wherein the at least one skip level via extends through the second dielectric material layer of the second level between the power structure and the ground structure.

In Example 3, the subject matter of Example 2 can optionally include the at least one of the power structure and the ground structure having a notch adjacent the at least one skip level via.

In Example 4, the subject matter of Example 1 can optionally include the at least one power/ground structure including at least one opening extending therethrough, wherein a portion of the second dielectric material layer is disposed within the at least one opening, and wherein the at least one skip level via extends through the at least one opening within the portion of the second dielectric material layer.

Example 5 is an integrated circuit device, comprising an electronic substrate; and a metallization structure on the electronic substrate including a first level comprising a first dielectric material layer; a second level on the first level, wherein the second level comprises a second dielectric material layer; a third level on the second level, wherein the third level comprises a third dielectric material layer; at least one power/ground structure in the second level; and at least one skip level via extending at least partially through the first dielectric material layer of the first level, through the second dielectric material layer of the second level, and at least partially through the third dielectric material layer of the third level, wherein the at least one skip level via comprises a continuous conductive material.

In Example 6, the subject matter of Example 5 can optionally include the at least one power/ground structure comprising a power structure and a ground structure, and wherein the at least one skip level via extends through the second dielectric material layer of the second level between the power structure and the ground structure.

In Example 7, the subject matter of Example 6 can optionally include the at least one of the power structure and the ground structure having a notch adjacent the at least one skip level via.

In Example 8, the subject matter of Example 5 can optionally include the at least one power/ground structure including at least one opening extending therethrough, wherein a portion of the second dielectric material layer is disposed within the at least one opening, and wherein the at least one skip level via extends through the at least one opening within the portion of the second dielectric material layer.

Example 9 is an electronic system, comprising a board and an integrated circuit device electrically attached to the board, wherein the integrated circuit device comprises an electronic substrate; and a metallization structure on the electronic substrate including a first level comprising a first dielectric material layer; a second level on the first level, wherein the second level comprises a second dielectric material layer; a third level on the second level, wherein the third level comprises a third dielectric material layer; at least one power/ground structure in the second level; and at least one skip level via extending at least partially through the first dielectric material layer of the first level, through the second dielectric material layer of the second level, and at least partially through the third dielectric material layer of the third level, wherein the at least one skip level via comprises a continuous conductive material.

In Example 10, the subject matter of Example 9 can optionally include the at least one power/ground structure comprising a power structure and a ground structure, and wherein the at least one skip level via extends through the second dielectric material layer of the second level between the power structure and the ground structure.

In Example 11, the subject matter of Example 10 can optionally include the at least one of the power structure and the ground structure having a notch adjacent the at least one skip level via.

In Example 12, the subject matter of Example 9 can optionally include the at least one power/ground structure including at least one opening extending therethrough, wherein a portion of the second dielectric material layer is disposed within the at least one opening, and wherein the at least one skip level via extends through the at least one opening within the portion of the second dielectric material layer.

Example 13 is a method of fabricating an integrated circuit structure comprising forming a first level comprising a first dielectric material layer; forming a second level on the first level, wherein the second level comprises a second dielectric material layer; forming a third level on the second level, wherein the third level comprises a third dielectric material layer; forming at least one power/ground structure in the second level; forming at least one opening extending at least partially through the first dielectric material layer of the first layer, through the second dielectric material layer of the second layer, and at least partially through the third dielectric material layer of the third level; and disposing a continuous conductive material within the opening to form a skip level via extending at least partially through the first dielectric material layer of the first layer, through the second dielectric material layer of the second layer, and at least partially through the third dielectric material layer of the third level.

In Example 14, the subject matter of Example 13 can optionally include the at least one power/ground structure comprising a power structure and a ground structure, and wherein the at least one skip level via extends through the second dielectric material layer of the second level between the power structure and the ground structure.

In Example 15, the subject matter of Example 14 can optionally include the at least one of the power structure and the ground structure having a notch adjacent the at least one skip level via.

In Example 16, the subject matter of Example 13 can optionally include the at least one power/ground structure including at least one opening extending therethrough, wherein a portion of the second dielectric material layer is disposed within the at least one opening, and wherein the at least one skip level via extends through the at least one opening within the portion of the second dielectric material layer.

In Example 17, the subject matter of Example 13 can optionally include forming an integrated circuit device by forming electronic substrate and forming a metallization layer on the electronic substrate, wherein the metallization layer includes the first level, the second level, the third level, at least one power/ground structure in the second level, and at least one skip level via.

In Example 18, the subject matter of Example 17 can optionally include forming the electronic substrate includes forming a transistor therein and electrically connecting the transistor to the skip level via.

In Example 19, the subject matter of either Example 17 or 18 can optionally include forming an electronic board and electrically attaching the electronic substrate to the electronic board.

In Example 20, the subject matter of any of Examples 17 to 19 can optionally include electrically attaching a second integrated circuit device to the metallization layer of first integrated circuit device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. An integrated circuit structure, comprising:
   a first conductive via;
   a first conductive pad or trace on the first conductive via;
   a second conductive via extending from the first conductive pad or trace;
   a second conductive pad or trace on the second conductive via;
   a dielectric material layer over the second conductive pad or trace;

a first conductive structure and a second conductive structure in the dielectric material layer, the second conductive structure laterally spaced apart from the first conductive structure;

a third conductive pad or trace over the dielectric material layer; and a third conductive via extending from the second conductive pad or trace to the third conductive pad or trace, the third conductive via extending through the dielectric material layer in a region between the first conductive structure and the second conductive structure, and the third conductive via continuous from the second conductive pad or trace to the third conductive pad or trace.

2. The integrated circuit structure of claim 1, wherein the third conductive via is a skip level via.

3. The integrated circuit structure of claim 1, further comprising:
a second dielectric material layer below the dielectric material layer, wherein the third conductive via extends through the second dielectric material layer.

4. The integrated circuit structure of claim 1, wherein the first conductive structure is a power structure Vcc.

5. The integrated circuit structure of claim 1, wherein the second conductive structure is a ground structure Vss.

6. The integrated circuit structure of claim 1, wherein the second conductive via is vertically over the first conductive via.

7. The integrated circuit structure of claim 1, wherein the third conductive via is vertically over the second conductive via.

8. The integrated circuit structure of claim 1, wherein the second conductive via is vertically over the first conductive via, and wherein the third conductive via is vertically over the second conductive via.

9. An integrated circuit structure, comprising:
a first conductive via;
a first conductive pad on the first conductive via;
a second conductive via extending from the first conductive pad;
a second conductive pad on the second conductive via;
a plurality of dielectric material layers over the second conductive pad;
a first conductive structure and a second conductive structure in one of the plurality of dielectric material layers, the second conductive structure laterally spaced apart from the first conductive structure;
a third conductive pad over the plurality of dielectric material layers, the third conductive pad above the first conductive structure and the second conductive structure; and
a skip level via extending from the second conductive pad to the third conductive pad, the skip level via extending through the plurality of dielectric material layers and between the first conductive structure and the second conductive structure.

10. The integrated circuit structure of claim 9, wherein the skip level via has no layers or breaks in breaks in continuity of the conductive material of the skip level via.

11. The integrated circuit structure of claim 9, wherein the first conductive structure is a power structure Vcc, and wherein the second conductive structure is a ground structure Vss.

12. The integrated circuit structure of claim 9, wherein the skip level via is vertically over the second conductive via.

* * * * *